United States Patent [19]

Foote et al.

[11] Patent Number: 5,710,067
[45] Date of Patent: Jan. 20, 1998

[54] SILICON OXIME FILM

[75] Inventors: David K. Foote; Subash Gupta, both of San Jose, Calif.

[73] Assignee: Advanced Micro Devices, Inc., Sunnyvale, Calif.

[21] Appl. No.: 479,718

[22] Filed: Jun. 7, 1995

[51] Int. Cl.$^6$ .................................................. H01L 21/316
[52] U.S. Cl. .................. 437/238; 437/241; 427/574; 427/579; 423/325; 257/632; 257/649
[58] Field of Search ...................... 437/238 US, 241 US; 427/574, 578, 579; 423/324, 325, 344; 257/632, 649

[56] References Cited

U.S. PATENT DOCUMENTS

| | | | |
|---|---|---|---|
| 3,422,321 | 1/1969 | Tombs | 317/235 |
| 3,874,919 | 4/1975 | Lehman | 117/212 |
| 4,532,022 | 7/1985 | Takasaki et al. | 204/192 D |
| 4,543,707 | 10/1985 | Ito et al. | 29/578 |
| 4,762,728 | 8/1988 | Keyser et al. | 427/38 |
| 4,871,619 | 10/1989 | Bergami et al. | 437/67 |
| 4,988,423 | 1/1991 | Yamamoto et al. | 204/192.17 |
| 5,071,790 | 12/1991 | Kim | 437/195 |
| 5,194,777 | 3/1993 | Nakaya et al. | 313/509 |
| 5,252,515 | 10/1993 | Tsai et al. | 437/195 |
| 5,260,236 | 11/1993 | Petro et al. | 437/241 |
| 5,378,659 | 1/1995 | Roman et al. | 437/229 |

OTHER PUBLICATIONS

T. Tanaka et al., "A New Photolithography Technique with Antireflective Coating on Resist: ARCOR," J. Electrochem. Soc., vol. 137, No. 12, Dec. 1990, pp. 3900–3905.

T. Ogawa et al., "$SiO_xN_y$:H, high performance anti-reflective layer for current and future optical lithography".

M. Armacost et al., "Selective Oxide: Nitride Dry Etching in a High Density Plasma Reactor," Electrochemical Society Meeting, 1993, Extended Abstract, col. 93-1, p. 369.

T. Gocho et al., "Chemical Vapor Deposition of Anti-Reflective Layer Film for Excimer Laser Lithography," Japanese Journal of Applied Physics, vol. 33, Jan. 1994, Pt. 1, No. 1B, pp. 486–490.

"Use of Oxidized Silicon Nitride as an Etch Stop for Plasma Etching", IBM Tech. Disclosure Bulletin (Sep. 1980) vol. 23, No. 4, p. 1360. ISSN:0018–8689.

Wolf, Stanley, "Silicon Processing for the VLSI Era", vol. 1, Lattice Press; Sunset Beach CA; (1986) pp. 427 & 465.

Wolf, Stanley "Silicon Processing for the VLSI Era", vol. 2, Lattice Press; Sunset Beach, CA; (1990) pp. 132–133.

Wolf, Stanley, Silicon Processing for the VLSI Era, vol. 1, (1986) pp. 171–174, 183–185, 191–194.

*Primary Examiner*—Charles L. Bowers, Jr.
*Assistant Examiner*—Matthew Whipple
*Attorney, Agent, or Firm*—Lowe, Price, LeBlanc & Becker

[57] ABSTRACT

A silicon oxime film is formed by plasma enhanced chemical vapor deposition. The silicon oxime film is useful as an anti-reflection layer during photolithography, as an etch stop, and as a protection layer.

101 Claims, 4 Drawing Sheets

SILICON OXIME FILM

TECHNICAL FIELD

The present invention relates to a silicon oxime film, its use in semiconductor manufacturing, and a method for depositing the film. The silicon oxime film of the present invention has particular utility as an anti-reflection coating.

BACKGROUND ART

The escalating requirements for high density and performance associated with ultra large scale integration require responsive changes in conductive patterns, which is considered one of the most demanding aspects of ultra large scale integration technology. High density demands for ultra large scale integration semiconductor wiring require increasingly denser arrays with minimal spacing between conductive lines. The increasing demands for high densification impose correspondingly high demands on photolithographic techniques.

Conventional photolithographic techniques employed during various phases in the manufacture of semiconductor devices involve the formation of an anti-reflective coating (ARC), also characterized as an anti-reflective layer (ARL), typically positioned between a semiconductor substrate and a photoresist material. ARCs are conventionally made of various materials, including organic and inorganic. For example, inorganic materials conventionally employed for ARCs include silicon nitride, silicon oxynitride, α-carbon, titanium nitride, silicon carbide and amorphous silicon. Organic materials conventionally employed for ARCs include spin-on polyimides and polysulfones. Conventional ARCs are designed, by appropriate adjustment of variables such as composition, deposition conditions and reaction conditions, to exhibit the requisite optical parameters to suppress multiple interference effects caused by the interference of light rays propagating in the same direction due to multiple reflections in the photoresist film. The effective use of an ARC enables patterning and alignment without disturbance caused by such multiple interference, thereby improving line width accuracy and alignment, critical factors with respect to achieving fine line conductive patterns with minimal interwiring spacing. The use of an ARC is particularly significant when forming a via or contact hole over a stepped area, as when etching a dielectric layer deposited on a gate electrode and gate oxide formed on a semiconductor substrate in manufacturing a field effect transistor.

The physics involved in ARCs is known and the use of ARCs is conventional and, hence, will not be set forth herein detail. See, for example, T. Tanaka et al., "A New Photolithography Technique with Antireflective Coating on Resist: ARCOR," J. Electrochem. Soc., Vol. 137, No. 12, December 1990, pp. 3900–3905. ARCs have improved the accuracy of ultra-violet and deep ultra-violet lithography, and expanded to the use of ion beam, I-line, KrF and ArF excimer laser lithography. T. Ogawa et al., "SiO$_x$N$_y$:H, high performance anti-reflective layer for current and future optical lithography." Recently, an effort has been made to develop improved dry etching techniques for ARCs, including particularly silicon oxynitride. M. Armacost et al., "Selective Oxide: Nitride Dry Etching in a High Density Plasma Reactor," Electrochemical Society Meeting, 1993, Extended Abstract, column 93-1, p. 369. Efforts have been made to engineer the optical parameters of an ARC, as by adjusting process variables impacting the refractive index during plasma enhanced chemical vapor deposition (PECVD). T. Gocho et al., "Chemical Vapor Deposition of Anti-Reflective Layer Film for Excimer Laser Lithography," Japanese Journal of Applied Physics, Vol. 33, January 1994, Pt. 1, No. 1B, pp. 486–490.

Notwithstanding such efforts, conventional photolithographic capabilities constitute a severe limiting factor in reducing the design rule or maximum dimension of a conductive pattern and, hence, increasing densification. Accordingly, there exists a need for materials having the requisite optical properties for use in ARCs which enable accurate control of the width of conductive lines of conductive patterns and minimizing the interwiring spacing therebetween, particularly for materials which exhibit desirable etch characteristics.

DISCLOSURE OF THE INVENTION

An object of the present invention is a material having optical properties suitable for use as an ARC.

Another object of the present invention is a material which exhibits high etch selectivity with respect to conventional dielectric materials employed in manufacturing semiconductor devices.

Additional objects, advantages and other features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

According to the present invention, the foregoing and other objects are achieved in part by a film comprising silicon oxime having the formula $Si_{(1-x-y-z)}N_xO_y:H_z$, wherein x, y and z represent the atomic percentage of nitrogen, oxygen and hydrogen, respectively.

Another aspect of the present invention is a semiconductor device having a conductive wiring pattern comprising a plurality of layers including a layer comprising silicon oxime having the formula $Si_{(1-x-y-z)}N_xO_y:H_z$.

A further aspect of the present invention is a semiconductor device having an insulating layer comprising a plurality of layers including a layer comprising silicon oxime having the formula $Si_{(1-x+y+z)}N_xO_y:H_z$.

Another aspect of the invention is a method of forming a film comprising silicon oxime, which method comprises depositing a layer of silicon oxime having the formula $Si_{(1-x-y-z)}N_xO_y:H_z$ on a substrate by PECVD.

A further aspect of the present invention is a method of manufacturing a semiconductor device, which method comprises depositing a layer of silicon oxime having the formula $Si_{(1-x-y-z)}N_xO_y:H_z$ by PECVD on a substrate under dynamic, non-equilibrium conditions in the presence of a stoichiometric excess of nitrogen sufficient to substantially prevent bonding between silicon atoms and oxygen atoms.

Additional objects and advantages of the present invention will become readily apparent to those skilled in this art from the following detailed description, wherein only the preferred embodiment of the invention is shown and described, simply by way of illustration of the best mode contemplated for carrying out the invention. As will be realized, the invention is capable of other and different embodiments, and its several details are capable of modifications in various obvious respects, all without departing from the invention. Accordingly, the drawings and description are to be regarded as illustrative in nature, and not as restrictive.

DESCRIPTION OF THE INVENTION

The increasing demands for accurate fine line patterns, minimal interwiring spacings, and reliable interlayer contacts and vias, require expansion of the capabilities, and improvements in the accuracy, of photolithographic techniques. The limitations on desirably minimal dimensions of conductive patterns imposed by photolithographic technology can be overcome by the development of materials having improved optical characteristics and etch characteristics such as high etch selectivity with respect to dielectric materials conventionally employed in the manufacture of semiconductor devices. After extensive investigation and experimentation, we developed a new compound comprising silicon, oxygen, nitrogen and hydrogen, which is quite different from the conventional silicon nitride and silicon oxynitride materials, such as those typically employed in ARCs. The new compound differs from conventional silicon oxynitride material in several ways, including structural, physical, optical and chemical characteristics.

The new compound of the present invention differs structurally from conventional silicon oxynitride material in that the silicon atoms are bonded directly to the nitrogen atoms, while the oxygen atoms are bonded to the nitrogen atoms. The compound, which contains essentially no bonding between silicon and oxygen atoms, is characterized by the formula $Si_{(1-x-y-z)}N_xO_y:H_z$. We call this compound silicon oxime.

Figure 1:
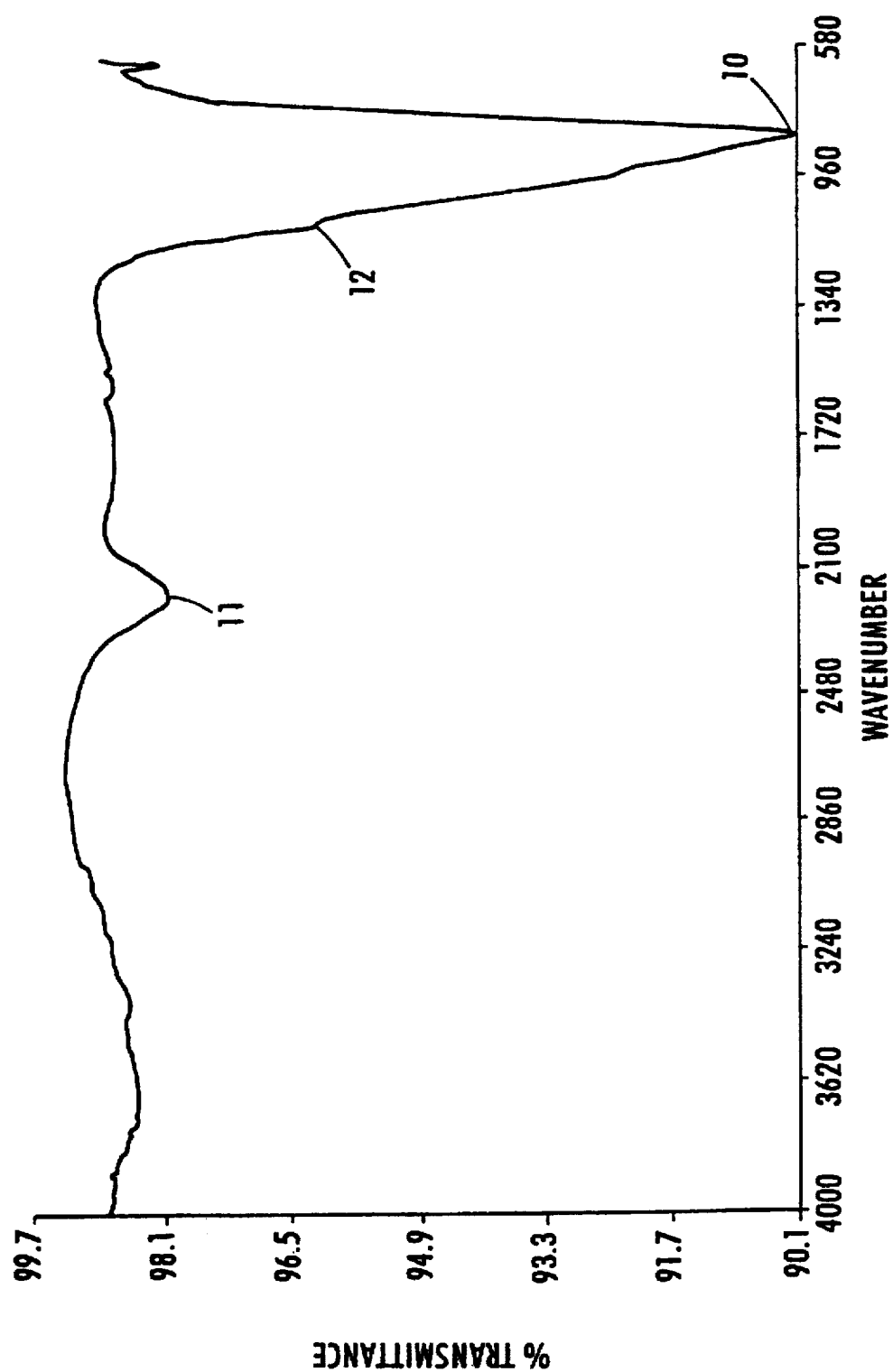
FIG. 1 is a Fourier Transform-Infrared (FT-IR) spectrum of silicon oxime in accordance with the present invention.

A typical FT-IR spectrum of the silicon oxime of the present invention is shown in FIG. 1 and is characterized by a Si-N peak (10) of high intensity at about 840 $cm^{-1}$ and the absence of an Si-O peak. A Si-H peak (11) of very low intensity is observed at about 2145 $cm^{-1}$, and an insignificant discontinuity is seen at about 1095 $cm^{-1}$ in the area of Si-O.

Figure 2:
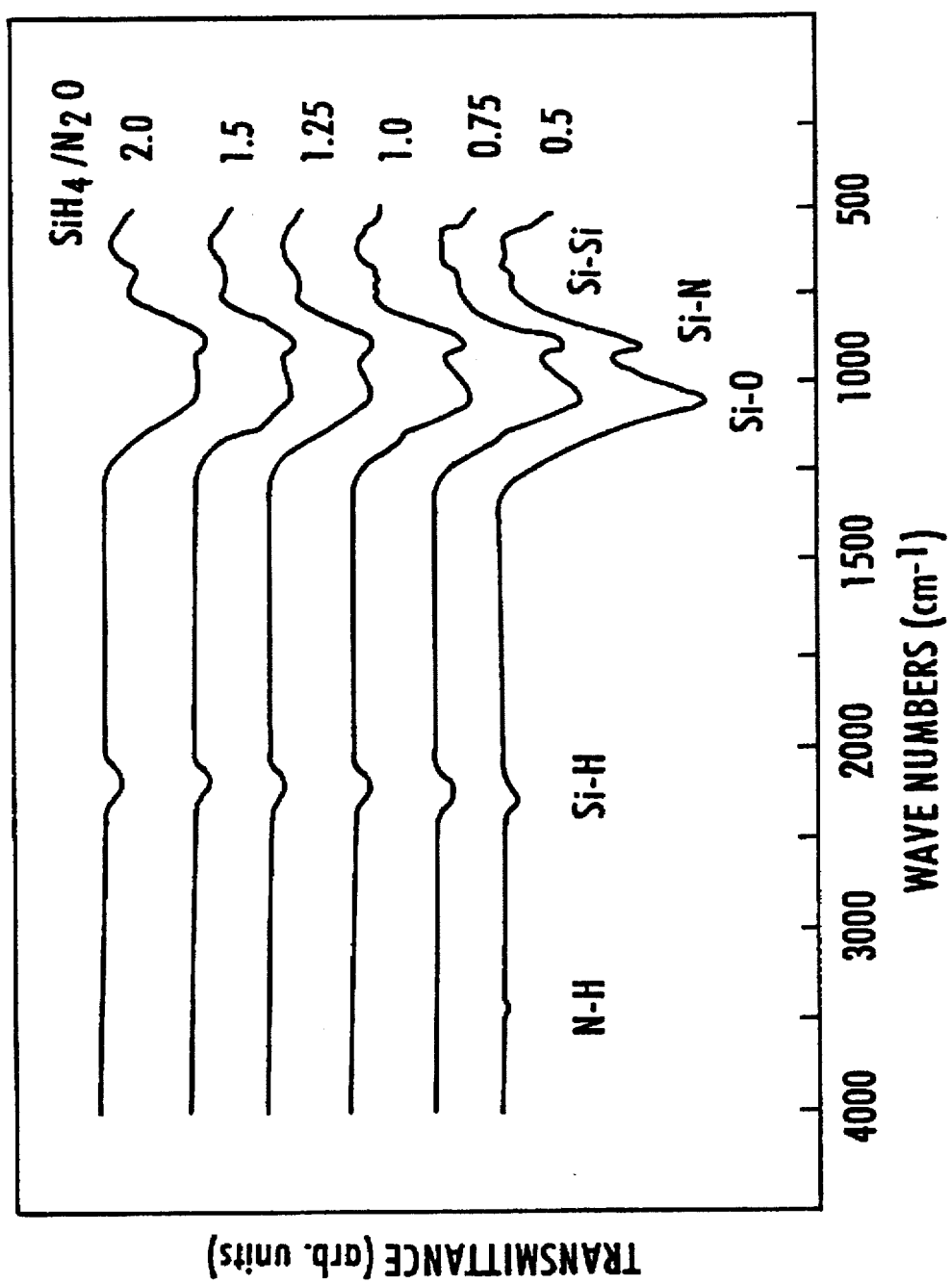
FIGS. 2 and 3 are FT-IR spectra of conventional silicon oxynitride materials.

FIG. 2 depicts the FT-IR spectra of $Si_{(1-x+y+z)}O_xN_y:H$ films deposited using various $SiH_4/N_2O$ ratios, reported by Gocho et al. in the Japan Journal of Applied Physics, Vol. 33, 1994, FIG. 8, at page 488. These compounds are characterized by significant Si-O peaks at about 1030 $cm^{-1}$ of varying intensity depending upon the $SiHy/N_2O$ ratio employed.

Figure 3:
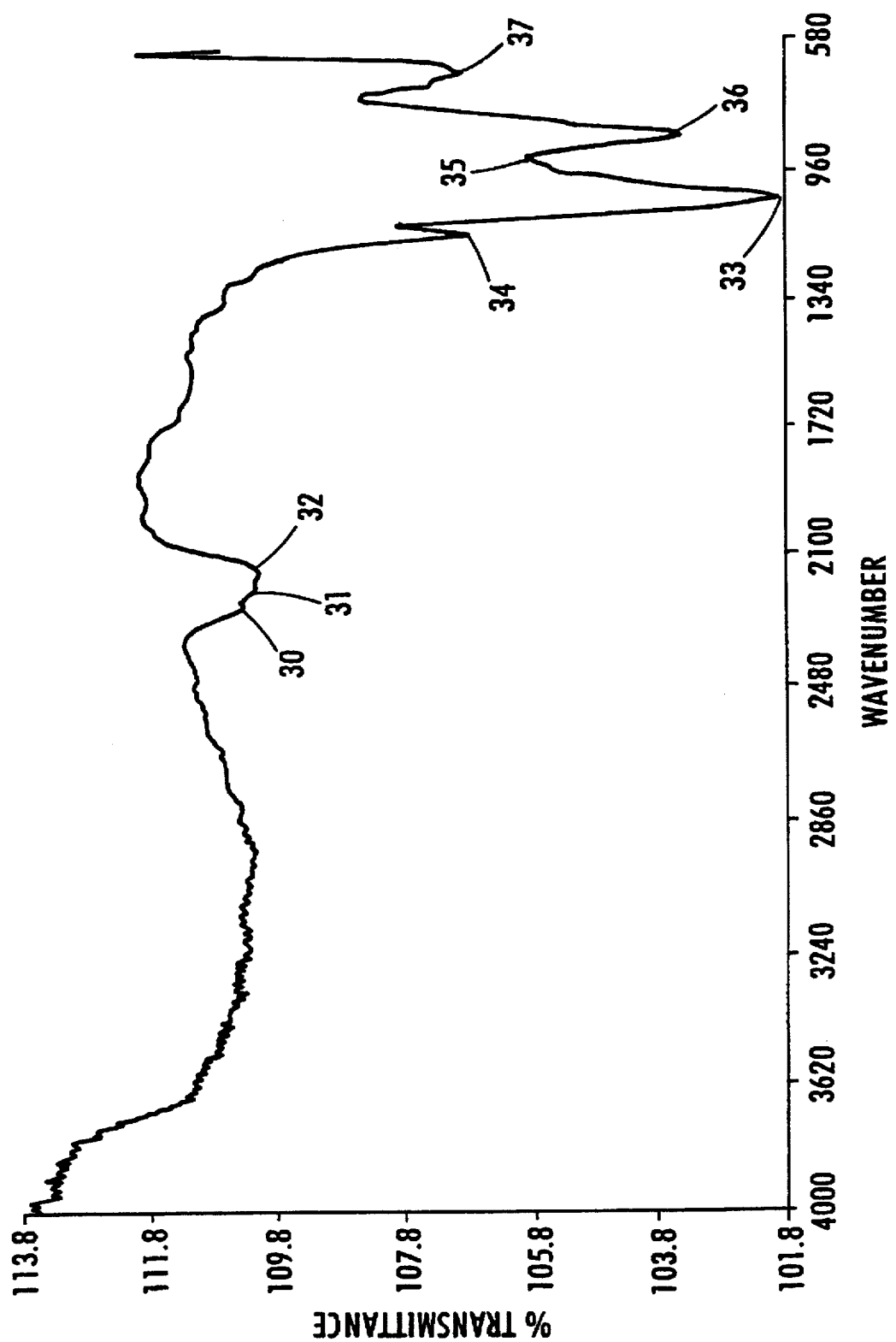

FIG. 3 shows the FT-IR spectrum of a sample supplied by Fujitsu. This compound is characterized by Si-H peaks (30, 31, 32) at about 2223 $cm^{-1}$, about 2180 $cm^{-1}$ and about 2141 $cm^{-1}$, respectively, of relatively weak intensity, a Si-O peak (33) at about 1037 $cm^{-1}$ of high intensity, a significant Si-O peak (34) at about 1133 $cm^{-1}$ of low intensity; and Si-N peaks (35, 36) at about 941 $cm^{-1}$ and about 849 $cm^{-1}$, respectively, of relatively high intensity. An unidentified peak (37) is observed at about 659 of moderate intensity.

A comparison of FIGS. 1, 2, 3 shows that the silicon oxime of the present invention is characterized by the substantial absence of an Si-O peak and, therefore, the substantial absence of bonding between Si atoms and oxygen atoms. The silicon oxime of the present invention is, therefore, properly characterized by the formula $Si_{(1-x-y-z)}N_xO_y:H_z$.

The silicon oxime of the present invention, particularly when formed as a thin film or layer, exhibits properties, particularly optical properties, which are significantly superior to those of silicon nitride and silicon oxynitride films conventionally employed as ARCs in the manufacture of semiconductor devices. Although emphasis is placed herein upon the manufacture of semiconductor devices, the silicon oxime of the present invention exhibits advantageous properties which render it useful in various applications in different technologies, apart from the manufacturer of semiconductor devices.

It has been found that the silicon oxime of the present invention can advantageously be formed into an effective ARC having a desirably low light reflectivity at a thickness considerably less than the thickness required of conventional ARCs comprising silicon nitride or silicon oxynitride materials to achieve a similar light reflectivity. Accordingly, the use of an ARC comprising the silicon oxime of the present invention enhances miniaturization as well as manufacturing speed.

It has also been found that the silicon oxime of the present invention is resistant to dry plasma etches which would normally etch silicon oxide. This advantageous etch characteristic renders the silicon oxime of the present invention particularly suitable as an etch stop material in various phases during the manufacture of semiconductor devices to improve dimensional accuracy. It has also been found that the silicon oxime of the present invention can be stripped with hot phosphoric acid like silicon nitride; whereas, silicon oxynitride and silicon oxide are resistant to hot phosphoric acid. Accordingly, the silicon oxime of the present invention can be advantageously employed during processing and stripped from a dielectric layer without any significant damage to the dielectric layer. The foregoing desirable optical properties and etch characteristics also render the silicon oxime of the present invention useful in various technologies wherein silicon nitride and/or silicon oxynitride have previously been employed, apart from the manufacture of semiconductor devices.

Silicon oxime, according to the present invention, can be produced by reacting source gases for the components, i.e., silicon, nitrogen, oxygen and hydrogen, under dynamic conditions employing a stoichiometric excess amount of nitrogen, sufficient to substantially prevent oxygen atoms from reacting with silicon atoms. The stoichiometric excess amount of nitrogen can be easily determined in a particular situation. Preferably, the amount of nitrogen is at least ten times the amount of oxygen present during reaction. In forming silicon nitride by PECVD, it is preferred to conduct the deposition under steady state conditions in a nitrogen-rich atmosphere.

In a preferred embodiment, silicon oxime is formed by reactive deposition under dynamic conditions employing a conventional PECVD reactor, such as that typically employed to deposit silicon oxynitride. However, the conditions under which the reaction is conducted differ from the conditions conventionally employed to deposit silicon oxynitride. Typically, silicon oxynitride (SiON:H) is deposited under equilibrium conditions in a PECVD reactor. However, in accordance with the present invention, silicon oxime is produced during the non-equilibrium conditions that exist at the on-set of a glow discharge in the PECVD reactor, employing a stoichiometric excess amount of nitrogen to substantially prevent bonding between silicon and oxygen atoms. In a preferred aspect of this embodiment, reactive deposition of silicon oxime in a PECVD reactor is conducted in a nitrogen atmosphere to effectively preclude bonding of silicon and oxygen atoms. The temperature employed for the reaction can range from about 275° C. to about 475° C., preferably about 350° C. to about 450° C. The pressure employed during the deposition reaction can range from about 1 to about 10 Torr, preferably about 2 to about 3 Torr. Conventional PECVD equipment can be employed to produce the silicon oxime of the present invention by reactive deposition.

In accordance with the present invention, silicon oxime can be formed, preferably by a deposition in the PECVD reactor, as a film or layer on a substrate. The thickness of the film or layer of silicon oxime deposited in the PECVD reactor depends upon, inter alia, the duration of deposition. As the deposition of time increases, the amount of silicon oxime formed by reactive deposition increases. Thus, in accordance with the present invention, silicon oxime can be advantageously formed as a thin film or in any desirable configuration for a desired utility depending upon, inter alia, the shape of the substrate and duration of deposition of the intended application rather of the resulting compound, and removed from the substrate if desired, as by etching the substrate.

EXAMPLE

A silicon oxime film was formed by PECVD in a conventional PECVD reactor under the following conditions:

| | |
|---|---|
| temperature | 400° C. |
| pressure | 2.5 Torr |
| power | 190 watts |
| Gap | 425 mils |
| $SiH_4$ | 50–60 sccm |
| $N_2O$ | 35–45 sccm |
| $N_2$ | 500 sccm |

Under the above conditions, the deposition rate was about 75–85 Å/sec. and the uniformity measured at 1 to 2%, 1σ. Upon analysis, the silicon oxime was found to contain about 15 to about 20 atom percent oxygen, and about 10% to about 20 atom percent hydrogen. A silicon oxime film formed under the above conditions displays absorption characteristics at 365 nm very different from conventional silicon oxynitride films. For example, a silicon oxime film having a thickness of about 350 Å to about 400 Å on polysilicon exhibits a reflectivity of about 1 to 5%; whereas, in order to achieve the same level of reflectivity, i.e., about 1 to about 5%, a conventional silicon oxynitride film requires a thickness of about 700 Å to about 1100 Å.

It was unexpectedly found that in accordance with the present invention, a silicon oxime film having a low reflectivity suitable for use an ARC can be formed by PECVD at a thickness considerably less than that required for a conventional silicon oxynitride ARC of equivalent light reflectivity. Moreover, silicon oxime films in accordance with the present invention can be formed quite rapidly. The formation of an effective silicon oxime ARC having a thickness of about 400 Å on a polysilicon substrate required about 3 to about 5 seconds.

The ability to utilize a relatively thin ARC, formed in a short period of time, advantageously facilitates increased densification and increases production throughput. Thus, the use of a silicon oxime ARC in accordance with the present invention enables the obtainment of accurate fine line conductive patterns, with interwiring spacings less than 0.3 microns, preferably less than 0.2 microns. In accordance with the present invention, an effective silicon oxime ARC is rapidly obtained with a thickness less than that of conventional silicon oxynitride ARCs having similar light reflectivities. The complex refractive index of a silicon oxime ARC of the present invention, as with other ARCs, comprises a real part n and an imaginary part k, which can be optimized in a conventional manner to achieve desired optical properties.

A silicon oxime ARC in accordance with the present invention can be deposited on conductive and nonconductive layers comprising materials conventionally employed in the semiconductor industry. Such materials may comprise polysilicon, aluminum and alloys thereof such as aluminum-silicon alloys, refractory metals, such as tungsten, refractory metal alloys, such as titanium-tungsten, refractory metal compounds, and dielectric materials. The conductive layer may also comprise a plurality of conductive layers as conventionally employed in the manufacture of semiconductor devices. For example, the conductive layer may comprise a barrier layer for enhanced adhesion to the substrate. Such barrier layers may comprise titanium, titanium nitride or titanium-titanium nitride. A layer of conductive material, such as one of the aforementioned conductive materials, e.g., aluminum or tungsten, is formed on the barrier layer.

A preferred embodiment of the present invention comprises manufacturing a semiconductor device having accurately formed fine dimensions, such as fine line patterns, interwiring spacings, vias, trenches, and contact holes, by processing stages which comprise depositing a silicon oxime film. In a preferred aspect, a silicon oxime ARC is deposited on a conductive layer or an insulating layer, and a layer of photoresist material deposited thereon. The photoresist material is imagewise exposed through a photomask defining a desired conductive pattern, and developed. Etching is then conducted, using the developed photoresist as a mask, to form the conductive pattern comprising a plurality of accurately formed fine patterns with minimal interfeature spacing therebetween, such as less than about 0.5 microns. Advantageously, the silicon oxime ARC of the present invention can be employed in various photolithographic techniques, including deep ultra-violet, ion beam, I-line, $K_rF$ and $A_rF$ excimer laser lithography, to obtain accurate patterns having minimal dimensions, thereby improving miniaturization and production throughput.

The various semiconductor processing phases in which the silicon oxime film of the present invention is used involves otherwise conventional equipment, materials, and techniques, such as conventional etching techniques, preferably dry etching and high density plasma etching, using gases typically employed in standard dielectric etching systems.

Figure 4:
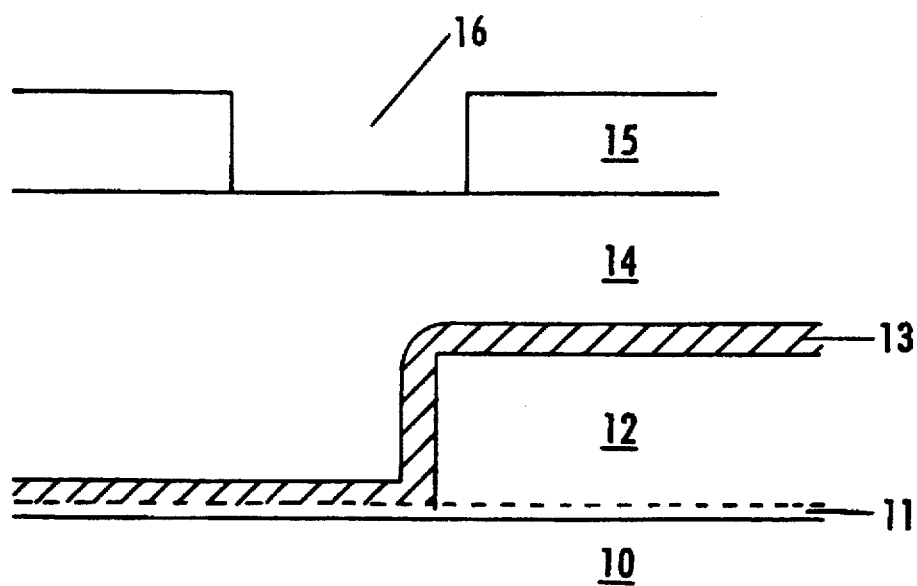
FIGS. 4 and 5 depict the use of a silicon oxime film in accordance with the present invention as an ARC in forming a via.
Figure 5:
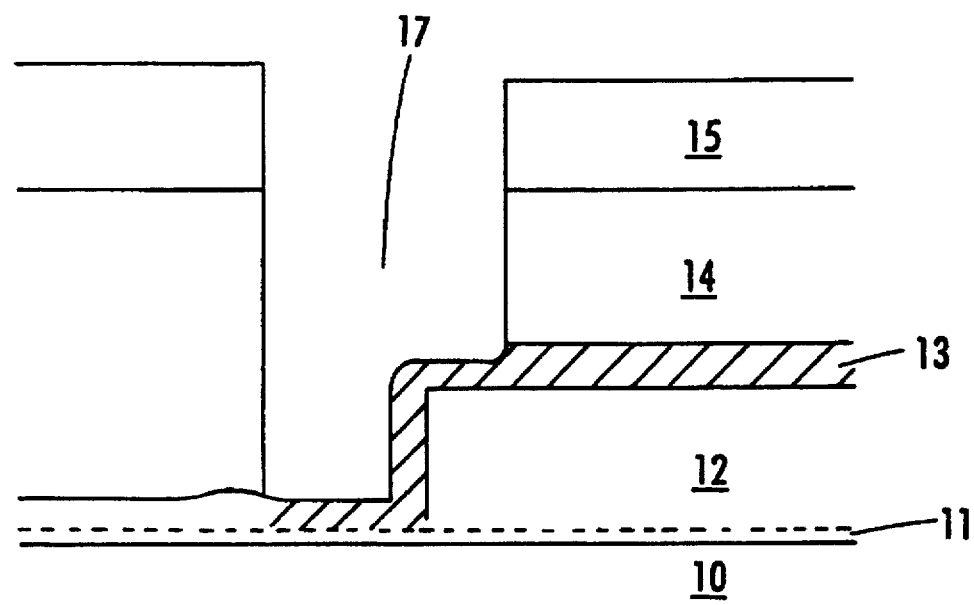

The silicon oxime ARC of the present invention can be employed in various phases of semiconductor processing in which ARCs are conventionally employed, particularly over a step which normally presents an accuracy problem in fine line photolithography. As shown in FIG. 4, in manufacturing a semiconductor device containing a field effect transistor, a gate oxide film 11 is formed on a semiconductor substrate 10, and a gate electrode 12, typically of polysilicon, is formed on gate oxide film 11. In accordance with the present invention, a silicon oxime film is deposited on gate electrode 12 and gate oxide 11 in a region in which a contact is to be formed. A layer of dielectric material 14 is then deposited. Suitable dielectric materials include silicon dioxide, preferably derived from deposited tetraethyl orthosilicate (TEOS), or boron-phosphorous glass (BPSG), a silicon glass doped with boron and phosphorous. A layer of photoresist material 15 is then deposited, imagewise exposed, and developed to form a mask opening 16 through which etching is conducted to form contact 17, shown in FIG. 5.

The use of a silicon oxime ARC enables the formation of contacts having accurate fine dimensions over a stepped region. Advantageously, the subsequent removal of the silicon oxime film which functions as an etch stop layer over polysilicon and the gate oxide region can easily be achieved with hot phosphoric acid since the etch rate of the silicon oxime is very significantly faster than the polysilicon or silicon oxide film.

Another aspect of the present invention comprises depositing a layer of silicon oxime on a dielectric material, such as silicon dioxide, for contact printing with an I-line or deep UV photoresist material.

The unique etch characteristics of silicon oxime render it useful in forming etch stop layers during various phases of semiconductor manufacturing. For example, silicon oxime exhibits high resistance to conventional dry plasma etching, including etch recipes comprising freons and freons with inert gases. It has been found that the dry plasma etchability of silicon oxime is only 10% of $SiO_2$; whereas, the etchability silicon nitride is about 50% to about 60% of $SiO_2$ while the etchability conventional silicon oxynitride is about 70% to about 75% of $SiO_2$. Therefore, a silicon oxime film formed in accordance with the present invention can advantageously be employed as an etch stop material to prevent substantial attack of underlying layers.

The above-noted exemplified utilities of silicon oxime formed in accordance with the present invention is not to be considered limiting, nor is the utility of such silicon oxime confined to ARCs or to the manufacture of semiconductor devices. The silicon oxime of the present invention can be employed in various technologies wherein silicon nitride and silicon oxynitride have heretofore been employed. For example, the silicon oxime of the present invention can be employed in the fabrication of optical waveguides, and masks for X-ray lithography.

In accordance with the present invention, a novel silicon oxime material and method of formation have been developed. Silicon oxime films are particularly useful during various phases in the manufacture of semiconductor devices. For example, silicon oxime ARCs exhibit advantageous optical characteristics enabling the accurate formation of accurate fine patterns having minimal features and spacings, such as less than about 0.3 microns, preferably less than about 0.2 microns. The uniquely desirable etch characteristics of silicon oxime enable its use as an etch stop layer to protect underlying layers or materials. Silicon oxime can also be stripped without adversely significantly damaging an underlying dielectric layer.

Only the preferred embodiment of the invention and but a few examples of its versatility are shown and described in the present disclosure. It is to be understood that the invention is capable of use in various other combinations and environments and is capable of changes or modifications within the scope of the inventive concept as expressed herein.

We claim:

1. A film comprising a layer of silicon oxime having the formula $Si_{(1-x-y-z)}N_xO_y:H_z$, wherein x, y and z represent the atomic percentage of nitrogen, oxygen and hydrogen, respectively, wherein the silicon oxime comprises about 10–20 atom percent hydrogen and has a thickness of about 200 Å to about 600 Å.

2. The film according to claim 1, comprising a plurality of layers.

3. The film according to claim 2, comprising a semiconductive or conductive layer and a layer of silicon oxime thereon.

4. The film according to claim 3, wherein the semiconductive layer comprises polycrystalline microcrystalline, and/or amorphous silicon.

5. The film according to claim 3, wherein the conductive layer comprises a material selected from the group consisting of aluminum, aluminum-silicon alloys, refractory metals, refractory metal alloys and refractory metal compounds, and semiconductive materials doped with impurities.

6. The film according to claim 3, wherein the conductive layer comprises a barrier layer of titanium, titanium nitride or titanium-tungsten, and a layer of a conductive material thereon.

7. The film according to claim 2, comprising an insulating layer and a layer of silicon oxime thereon.

8. The film according to claim 7, wherein the insulating layer comprises a material selected in the group consisting of silicon dioxide and silicon nitride.

9. A semiconductor device having a semiconductor or conductor feature pattern comprising the film according to claim 4.

10. A semiconductor device having an insulating layer comprising the film according to claim 7.

11. A semiconductor device containing the film according to claim 1.

12. The silicon oxime according to claim 1, having a thickness of about 400 Å.

13. The silicon oxime according to claim 1, having a light reflectivity at 365 nm not greater than 2%.

14. The film according to claim 1, wherein the silicon oxime comprises about 15 to about 25 atom percent oxygen.

15. A method of producing a film comprising a layer of silicon oxime having the formula $Si_{(1-x-y-z)}N_xO_y:H_z$, wherein x, y and z represent the atomic percentage of nitrogen, oxygen and hydrogen, respectively, which method comprises reacting sources of silicon, nitrogen, oxygen and hydrogen in the presence of a stoichiometric excess of nitrogen sufficient to substantially prevent bonding between silicon atoms and oxygen atoms, at a temperature of about 275° C. to about 475° C. and at a pressure of about 1 to about 10 Torr, wherein the silicon oxime has a thickness of about 100 Å to about 600 Å.

16. The method according to claim 15, wherein the amount of nitrogen present is greater than ten times the amount of oxygen present and the silicon oxime comprises about 10–20 atom percent hydrogen.

17. A method of forming a film comprising silicon oxime having the formula of $Si_{(1-x-y-z)}N_xO_y:H_z$, wherein x, y and z represent the atomic percentage of nitrogen, oxygen and hydrogen, respectively, which method comprises depositing a layer of silicon oxime having the formula $Si_{(1-x-y-z)}N_xO_y:H_z$ on a substrate by plasma enhanced chemical vapor deposition, wherein deposition is conducted at a temperature of about 275° C. to about 475° C., and a pressure of from about 1 to about 10 torr, and wherein said silicon oxime layer has a thickness of about 200 Å to about 600 Å.

18. The method according to claim 17, conducted under dynamic non-equilibrium conditions in the presence of a stoichiometric excess of nitrogen sufficient to substantially prevent bonding between silicon atoms and oxygen atoms.

19. The method according to claim 18, comprising reacting source gases for silicon and nitrogen.

20. The method according to claim 19, wherein the source gas for silicon is silane and the source gas for nitrogen is nitrous oxide or nitrogen gas.

21. The method according to claim 17, wherein the silicon oxime comprises about 10–20 atom percent hydrogen.

22. The method according to claim 18, wherein deposition is conducted at a temperature of about 350° C. to about 450° C. and a pressure of from about 2 to about 3 Torr.

23. A method of manufacturing a semiconductor device, which method comprises depositing a layer of silicon oxime having the formula $Si_{(1-x-y-z)}N_xO_y:H_z$, wherein x, y and z represent the atomic percentage of nitrogen, oxygen and hydrogen, respectively, by plasma enhanced chemical vapor deposition on a substrate under dynamic non-equilibrium conditions in the presence of a stoichiometric excess of nitrogen sufficient to substantially prevent bonding between silicon atoms and oxygen atoms, and at a temperature of about 275° C. to about 475° C., wherein the silicon oxime comprises about 10–20 atom percent hydrogen and the layer has a thickness of about 200 Å to about 600 Å.

24. The method according to claim 23, wherein the substrate comprises a semiconductive or conductive material.

25. The method according to claim 24, wherein the semiconductive material comprises polycrystalline, microcrystalline and/or amorphous silicon.

26. The method according to claim 24, wherein the conductive material comprises aluminum, an aluminum silicon alloy, refractory metals, refractory metal alloys, and refractory metal compounds, and semiconductive materials doped with impurities.

27. The method according to claim 23, further comprising:
depositing a layer of photoresist material on the silicon oxime film;
imagewise exposing the layer of photoresist material through a photomask defining a desired pattern;
developing the exposed photoresist material; and
etching the underlying silicon oxime and substrate to form the pattern.

28. The method according to claim 27, wherein the substrate comprises a layer of conductive material, and the layer of photoresist material is imagewise exposed through a photomask defining a conductive pattern comprising a plurality of conductive lines and an interwiring spacing therebetween of less than about 0.3 microns.

29. The method according to claim 23, wherein the silicon oxime layer functions as an etch stop layer.

30. The method according to claim 23, wherein the substrate comprises an insulating material.

31. The method according to claim 30, wherein the insulating material is silicon dioxide.

32. The method according to claim 23, comprising depositing a silicon oxime anti-reflective coating on a substrate.

33. The method according to claim 32, further comprising:
depositing a layer of photoresist material on the silicon oxime anti-reflective coating;
imagewise exposing the photoresist material through a photomask defining a pattern comprising a plurality of fine features and spaces;
developing the exposed photoresist material; and
dry etching the underlying silicon oxime anti-reflective coating and substrate to form the pattern.

34. The method according to claim 32, wherein the silicon oxime anti-reflective coating has a light reflectivity at 365 nm not greater than about 2%.

35. The method according to claim 33, wherein the silicon oxime anti-reflective coating has a light reflectivity at 365 nm less than about 1%.

36. The film according to claim 1, having a light reflectivity at 365 nm of about 1% to about 35%.

37. An anti-reflective coating comprising the film according to claim 1 on a substrate for I-line and deep UV applications.

38. The silicon oxime film according to claim 1, wherein the silicon oxime comprises about 15% atomic percent hydrogen.

39. The silicon oxime film according to claim 2, which is soluble in hot phosphoric acid.

40. The silicon oxime film according to claim 2, which has a dry plasma etchability of about 10% of silicon dioxide.

41. The silicon oxime film according to claim 2, having a thickness of about 350 Å to about 400 Å and a reflectivity of about 1 to about 5% at 365 nm.

42. A multilayer film comprising: a semiconductive layer comprising polycrystalline, microcrystalline, and/or amorphous silicon; and a layer of silicon oxime thereon, wherein the silicon oxime has the formula $Si_{(1-x-y-z)}N_xO_y:H_z$, wherein x, y and z represent the atomic percentage of nitrogen, oxygen and hydrogen, respectively.

43. A semiconductor device containing the multilayer film according to claim 42.

44. The multilayer film according to claim 42, wherein the silicon oxime film has a thickness of about 200 Å to about 600 Å.

45. The multilayer film according to claim 44, wherein the silicon oxime film has a thickness of about 400 Å.

46. The multilayer film according to claim 42, wherein the silicon oxime film has a light reflectivity at 365 nm not greater than 2%.

47. The multilayer film according to claim 44, wherein the silicon oxime comprises about 15 to about 25 atom percent oxygen.

48. The multilayer film according to claim 47, wherein the silicon oxime comprises about 10–20 atom percent hydrogen.

49. The multilayer film according to claim 42, wherein the silicon oxime film has a light reflectivity at 365 nm of about 1% to about 35%.

50. The multilayer film according to claim 42, wherein the silicon oxime film comprises an anti-reflective coating on a substrate for I-line and deep UV applications.

51. The multilayer film according to claim 48, wherein the silicon oxime comprises about 15% atomic percent hydrogen.

52. A multilayer film comprising: a conductive layer comprising a barrier layer of titanium, titanium nitride or titanium-tungsten, a layer of a conductive material thereon; and a layer of silicon oxime on the conductive layer, wherein the silicon oxime has the formula $Si_{(1-x-y-z)}N_xO_y:H_z$, wherein x, y and z represent the atomic percentage of nitrogen, oxygen and hydrogen, respectively.

53. A semiconductor device containing the multilayer film according to claim 52.

54. The multilayer film according to claim 52, wherein the silicon oxime film has a thickness of about 200 Å to about 600 Å.

55. The multilayer film according to claim 54, wherein the silicon oxime film has a thickness of about 400 Å.

56. The multilayer film according to claim 53, wherein the silicon oxime film has a light reflectivity at 365 nm not greater than 2%.

57. The multilayer film according to claim 54, wherein the silicon oxime comprises about 15 to about 25 atom percent oxygen.

58. The multilayer film according to claim 57, wherein the silicon oxime comprises about 10–20 atom percent hydrogen.

59. The multilayer film according to claim 52, wherein the silicon oxime film has a light reflectivity at 365 nm of about 1% to about 35%.

60. The multilayer film according to claim 52, wherein the silicon oxime film comprises an anti-reflective coating on a substrate for I-line and deep UV applications.

61. The multilayer film according to claim 58, wherein the silicon oxime comprises about 15% atomic percent hydrogen.

62. A method of manufacturing a semiconductor device, which method comprises depositing a layer of silicon oxime having the formula $Si_{(1-x-y-z)}N_xO_y:H_z$, wherein x, y and z represent the atomic percentage of nitrogen, oxygen and hydrogen, respectively, by plasma enhanced chemical vapor deposition on a semiconductive substrate, comprising polycrystalline, microcrystalline and/or amorphous silicon, under dynamic non-equilibrium conditions in the presence of a stoichiometric excess of nitrogen sufficient to substantially prevent bonding between silicon atoms and oxygen atoms.

63. The method according to claim 62, further comprising:

depositing a layer of photoresist material on the silicon oxime film;

imagewise exposing the layer of photoresist material through a photomask defining a desired pattern;

developing the exposed photoresist material; and etching the underlying silicon oxime and substrate to form the pattern.

64. The method according to claim 62, wherein the silicon oxime layer functions as an etch stop layer.

65. The method according to claim 62, comprising depositing a silicon oxime anti-reflective coating on the substrate.

66. The method according to claim 62, further comprising:

depositing a layer of photoresist material on the silicon oxime anti-reflective coating;

imagewise exposing the photoresist material through a photomask defining a pattern comprising a plurality of fine features and spaces;

developing the exposed photoresist material; and dry etching the underlying silicon oxime anti-reflective coating and substrate to form the pattern.

67. The method according to claim 65, wherein the silicon oxime anti-reflective coating has a light reflectivity at 365 nm not greater than about 2%.

68. The method according to claim 66, wherein the silicon oxime anti-reflective coating has a light reflectivity at 365 nm less than about 1%.

69. A film comprising a layer of silicon oxime having the formula $Si_{(1-x-y-z)}N_xO_y:H_z$, wherein x, y and z represent the atomic percentage of nitrogen, oxygen and hydrogen, respectively, wherein the silicon oxime comprises about 10–20 atom percent hydrogen the layer of silicon oxime has a light reflectivity at 365 nm not greater than 2%.

70. The film according to claim 19, comprising a plurality of layers.

71. The film according to claim 70, comprising a semiconductive or conductive layer and a layer of silicon oxime thereon.

72. The film according to claim 71, wherein the semiconductive layer comprises polycrystalline microcrystalline, and/or amorphous silicon.

73. The film according to claim 71, wherein the conductive layer comprises a material selected from the group consisting of aluminum, aluminum-silicon alloys, refractory metals, refractory metal alloys and refractory metal compounds, and semiconductive materials doped with impurities.

74. The film according to claim 71, wherein the conductive layer comprises a barrier layer of titanium, titanium nitride or titanium-tungsten, and a layer of a conductive material thereon.

75. The film according to claim 70, comprising an insulating layer and a layer of silicon oxime thereon.

76. The film according to claim 75, wherein the insulating layer comprises a material selected in the group consisting of silicon dioxide and silicon nitride.

77. A semiconductor device having a semiconductor or conductor feature pattern comprising the film according to claim 71.

78. A semiconductor device having an insulating layer comprising the film according to claim 75.

79. A semiconductor device containing the film according to claim 69.

80. The silicon oxime according to claim 66, having a thickness of about 200 Å to about 600 Å.

81. The silicon oxime according to claim 80, having a thickness of about 400 Å.

82. The film according to claim 80, wherein the silicon oxime comprises about 15 to about 25 atom percent oxygen.

83. A method of producing a film comprising a layer of silicon oxime having the formula $Si_{(1-x-y-z)}N_xO_y:H_x$, wherein x, y and z represent the atomic percentage of nitrogen, oxygen and hydrogen, respectively, which method comprises reacting sources of silicon, nitrogen, oxygen and hydrogen in the presence of a stoichiometric excess of nitrogen sufficient to substantially prevent bonding between silicon atoms and oxygen atoms, at a temperature of about 275° C. to about 475° C. and at a pressure of about 1 to about 10 Torr, wherein the silicon oxime has a light reflectivity at 365 nm not greater than 2%.

84. The method according to claim 83, wherein the amount of nitrogen present is greater than ten times the amount of oxygen present and the silicon oxime comprises about 10–20 atom percent hydrogen.

85. A method of forming a film comprising silicon oxime having the formula of $Si_{(1-x-y-z)}N_xO_y:H_z$, wherein x, y and z represent the atomic percentage of nitrogen, oxygen and hydrogen, respectively, which method comprises depositing a layer of silicon oxime having the formula $Si_{(1-x-y-z)}N_xO_y:H_z$ on a substrate by plasma enhanced chemical vapor deposition, wherein deposition is conducted at a temperature of about 275° C. to about 475° C., and a pressure of from about 1 to about 10 torr, and the silicon oxime layer has a light reflectivity at 365 nm not greater than 2%.

86. The method according to claim 85, conducted under dynamic non-equilibrium conditions in the presence of a stoichiometric excess of nitrogen sufficient to substantially prevent bonding between silicon atoms and oxygen atoms.

87. The method according to claim 86, comprising reacting source gases for silicon and nitrogen.

88. The method according to claim 87, wherein the source gas for silicon is silane and the source gas for nitrogen is nitrous oxide or nitrogen gas.

89. The method according to claim 88, wherein the silicon oxime comprises about 10–20 atom percent hydrogen.

90. The method according to claim 85, wherein deposition is conducted at a temperature of about 350° C. to about 450° C. and a pressure of from about 2 to about 3 Torr.

91. A method of manufacturing a semiconductor device, which method comprises depositing a layer of silicon oxime having the formula $Si_{(1-x-y-z)}N_xO_y:H_z$, wherein x, y and z represent the atomic percentage of nitrogen, oxygen and hydrogen, respectively, by plasma enhanced chemical vapor deposition on a substrate under dynamic non-equilibrium conditions in the presence of a stoichiometric excess of nitrogen sufficient to substantially prevent bonding between silicon atoms and oxygen atoms, and at a temperature of about 275° C. to about 475° C., wherein the silicon oxime comprises about 10–20 atom percent hydrogen and the layer has a light reflectivity at 365 nm nut greater than 2%.

92. The method according to claim 91, wherein the substrate comprises a semiconductive or conductive material.

93. The method according to claim 92, wherein the semiconductive material comprises polycrystalline, microcrystalline and/or amorphous silicon.

94. The method according to claim 92, wherein the conductive material comprises aluminum, an aluminum silicon alloy, refractory metals, refractory metal alloys, and refractory metal compounds, and semiconductive materials doped with impurities.

95. The method according to claim 91, further comprising:
    depositing a layer of photoresist material on the silicon oxime film;
    imagewise exposing the layer of photoresist material through a photomask defining a desired pattern;
    developing the exposed photoresist material; and
    etching the underlying silicon oxime and substrate to form the pattern.

96. The method according to claim 95, wherein the substrate comprises a layer of conductive material, and the layer of photoresist material is imagewise exposed through a photomask defining a conductive pattern comprising a plurality of conductive lines and an interwiring spacing therebetween of less than about 0.3 microns.

97. The method according to claim 91, wherein the silicon oxime layer functions as an etch stop layer.

98. The method according to claim 91, wherein the substrate comprises an insulating material.

99. The method according to claim 98, wherein the insulating material is silicon dioxide.

100. The method according to claim 91, comprising depositing a silicon oxime anti-reflective coating on a substrate.

101. The method according to claim 100, further comprising:
    depositing a layer of photoresist material on the silicon oxime anti-reflective coating;
    imagewise exposing the photoresist material through a photomask defining a pattern comprising a plurality of fine features and spaces;
    developing the exposed photoresist material; and
    dry etching the underlying silicon oxime anti-reflective coating and substrate to form the pattern.

* * * * *

UNITED STATES PATENT AND TRADEMARK OFFICE
CERTIFICATE OF CORRECTION

PATENT NO. : 5,710,067
DATED : January 20, 1998
INVENTOR(S) : David K. FOOTE et al It is certified that error appears in the above-indentified patent and that said Letters Patent is hereby corrected as shown below:

Col. 8, line 21:
In Claim 9, "claim 4" should read as --claim 3--.
Col. 11, line 55:
In Claim 69, line 5, insert --and-- after hydrogen.
Col. 12, line 20:
In Claim 80, "claim 62" should read --claim 69--.
Col. 12, line 60:
In claim 89, "claim 88" should read --claim 85--.

Signed and Sealed this

First Day of December, 1998

Attest:

BRUCE LEHMAN

Attesting Officer

Commissioner of Patents and Trademarks